United States Patent
Saputra et al.

(10) Patent No.: US 12,278,632 B1
(45) Date of Patent: Apr. 15, 2025

(54) LOW POWER AUTO-SCALABLE DIFFERENTIAL PREDRIVER

(71) Applicant: QUALCOMM Incorporated, San Diego, CA (US)

(72) Inventors: Nitz Saputra, San Diego, CA (US); Sameer Wadhwa, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 69 days.

(21) Appl. No.: 18/485,882

(22) Filed: Oct. 12, 2023

(51) Int. Cl.
G06F 13/14 (2006.01)
G06F 13/42 (2006.01)
H03K 3/012 (2006.01)
H03K 17/687 (2006.01)

(52) U.S. Cl.
CPC ......... *H03K 3/012* (2013.01); *G06F 13/4282* (2013.01); *H03K 17/6871* (2013.01); *G06F 2213/0012* (2013.01)

(58) Field of Classification Search
None
See application file for complete search history.

(56) References Cited

U.S. PATENT DOCUMENTS

| 10,270,450 | B1 | 4/2019 | Ma et al. | |
|---|---|---|---|---|
| 2011/0234317 | A1* | 9/2011 | Arai | H03F 3/72 330/253 |
| 2014/0035549 | A1* | 2/2014 | Hafizi | G05F 3/08 323/311 |
| 2019/0044766 | A1* | 2/2019 | Lin | G11C 7/1096 |
| 2023/0253975 | A1 | 8/2023 | Hsieh et al. | |

OTHER PUBLICATIONS

Amirkhany A., et al., "A 12.8-Gb/s/link Tri-Modal Single-Ended Memory Interface", IEEE Journal of Solid-State Circuits, IEEE, USA, vol. 47, No. 4, Apr. 1, 2012, XP011440050, pp. 911-925, The Whole Document.
International Search Report and Written Opinion—PCT/US2024/047188—ISA/EPO—Dec. 23, 2024.
Liangxiao T., et al., "Swing-Programmable SST Transmitter with Power-Efficient De-Emphasis", Electronics Letters, The Institution of Engineering and Technology, GB, vol. 51, No. 12, Jun. 11, 2015, XP006052480, pp. 901-902, 2 pages, The Whole Document.

* cited by examiner

*Primary Examiner* — Henry Tsai
*Assistant Examiner* — Dean Phan
(74) *Attorney, Agent, or Firm* — Loza & Loza, LLP

(57) ABSTRACT

A transmitter includes driver slices coupled to its output. Each driver slice includes a first differential predriver that is selectively enabled and disabled by a first switch based on a control code configuration. A second differential predriver provides a first differential buffered data signal to a first group of driver slices when the second differential predriver is enabled. A second switch enables the second differential predriver when the control code is configured to enable the first differential predriver in at least one driver slice in the first group of driver slices. A third differential predriver provides a second differential buffered data signal to a second group of driver slices when the third differential predriver is enabled. A third switch enables the third differential predriver when the control code is configured to enable the first differential predriver in at least one driver slice in the second group of driver slices.

30 Claims, 8 Drawing Sheets

Predrivers That Pull Down Output When Disabled

Predrivers That Pull Up Output When Disabled

LOW POWER AUTO-SCALABLE DIFFERENTIAL PREDRIVER

TECHNICAL FIELD

The present disclosure generally relates to high-speed interfaces and, more particularly, to predriver circuits provided in a transmitter in a high-speed interface.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others. Physical layer (PHY) circuits used to provide a high-speed bus interface in IC devices typically used parallel layers of driver circuits to provide sufficient drive capability and/or to match bus impedance. The layers of driver circuits are driven by predriver circuits that consume significantly large, and sometimes excessive portions of the power used by the PHY circuits. There is an ongoing need for new and efficient PHY circuits that consume less power.

SUMMARY

Certain aspects of the disclosure relate to systems, apparatus, methods and techniques that can be used to reduce power consumption in transmitters provided in high-speed bus interface circuits. In one aspect, a low power auto-scalable differential pre-driver can be configured to enable or disable predriver circuits based on the number or combination of layers of driver circuits configured to drive a line of the high-speed bus.

In various aspects of the disclosure, a transmitter circuit coupled to a data communication link, includes driver slices coupled to an output of the transmitter circuit, each driver slice having a first differential predriver and a first switch that is configured to selectively enable and disable the first differential predriver of the each driver slice based on a configuration of a control code provided to the transmitter circuit. The transmitter circuit has a second differential predriver that is configured to provide a first differential buffered data signal to inputs of a first group of driver slices when the second differential predriver is enabled and a second switch configured to enable the second differential predriver when one or more bits of the control code are configured to enable the first differential predriver in at least one driver slice in the first group of driver slices. The transmitter circuit has a third differential predriver that is configured to provide a second differential buffered data signal to inputs of each of a second group of driver slices when the third differential predriver is enabled and a third switch configured to enable the third differential predriver when one or more bits of the control code are configured to enable the first differential predriver in at least one driver slice in the second group of driver slices.

In various aspects of the disclosure, an apparatus includes means for enabling first differential predrivers in driver slices when indicated by a control code and means for enabling buffer circuits when indicated by the control code. The means for enabling first differential predrivers in driver slices may include a first switch that is configured to enable the first differential predriver of a first driver slice provided in a first group of driver slices, and a second first switch that is configured to enable the first differential predriver of a second driver slice provided in a first group of driver slices. The means for enabling buffer circuits when indicated by the control code may include a second differential predriver that is enabled when the first driver slice is enabled and a third differential predriver that is enabled when the second driver slice is enabled. The second differential predriver may be configured to provide a first differential buffered data signal to inputs of the first group of driver slices when the second differential predriver is enabled. The third differential predriver may be configured to provide a second differential buffered data signal to inputs of the second group of driver slices when the third differential predriver is enabled.

In various aspects of the disclosure, method for transmitting a data signal over a communication link includes receiving a control code that is configured to enable one or more driver slices in a plurality of driver slices coupled to an output of a transmitter circuit coupled to the communication link; using a first switch to enable the first differential predriver of at least one driver slice in a first group of driver slices when indicated by the control code; enabling a second differential predriver when the at least one driver slice in the first group of driver slices is enabled; using a second first switch to enable the first differential predriver of at least one driver slice in a second group of driver slices when indicated by the control code; and enabling a third differential predriver when the at least one driver slice in the second group of driver slices is enabled. The second differential predriver is configured to provide a first differential buffered data signal to inputs of the first group of driver slices when the second differential predriver is enabled. The third differential predriver is configured to provide a second differential buffered data signal to inputs of the second group of driver slices when the third differential predriver is enabled.

In some implementations, each driver slice includes a differential voltage driver having an output coupled to the output of the transmitter circuit and an input coupled to an output of the first differential predriver in the each driver slice.

In certain aspects, a second differential predriver is configured to provide a first differential buffered data signal to inputs of a first group of driver slices when the second differential predriver is enabled. A second switch is configured to enable the second differential predriver when one or more bits of the control code are configured to enable the first differential predriver in at least one driver slice in the first group of driver slices. A third differential predriver is configured to provide a second differential buffered data signal to inputs of each of a second group of driver slices when the third differential predriver is enabled. A third switch is configured to enable the third differential predriver when one or more bits of the control code are configured to enable the first differential predriver in at least one driver slice in the second group of driver slices.

In one aspect, each driver slice in the first group of driver slices may be excluded from the second group of driver slices. In some implementations, the first group of driver slices includes more of the driver slices than the second group of driver slices.

In certain aspects, the transmitter circuit has a fourth differential predriver that is configured to propagate a differential input data signal to the second differential predriver when the fourth differential predriver is enabled. A fourth switch may be configured to enable the fourth differential predriver when a first differential predriver in at least one driver slice in the first group of driver slices is enabled. In one example, the fourth differential predriver is further configured to propagate the differential input data signal to the third differential predriver when a first differential predriver in at least one driver slice in the second group of driver slices is enabled. In another example, a fifth differential predriver is configured to propagate the differential input data signal to the third differential predriver when the fifth differential predriver is enabled. A fifth switch may be configured to enable the fifth differential predriver when a first differential predriver in at least one driver slice in the second group of driver slices is enabled. The fourth differential predriver may be configured to propagate the differential input data signal to a first set of buffer circuits that includes the second differential predriver. The fifth differential predriver may be configured to propagate the differential input data signal to a second set of buffer circuits that includes the third differential predriver. In some instances, the second set of buffer circuits includes more buffer circuits than the first set of buffer circuits.

DETAILED DESCRIPTION

Figure 1:
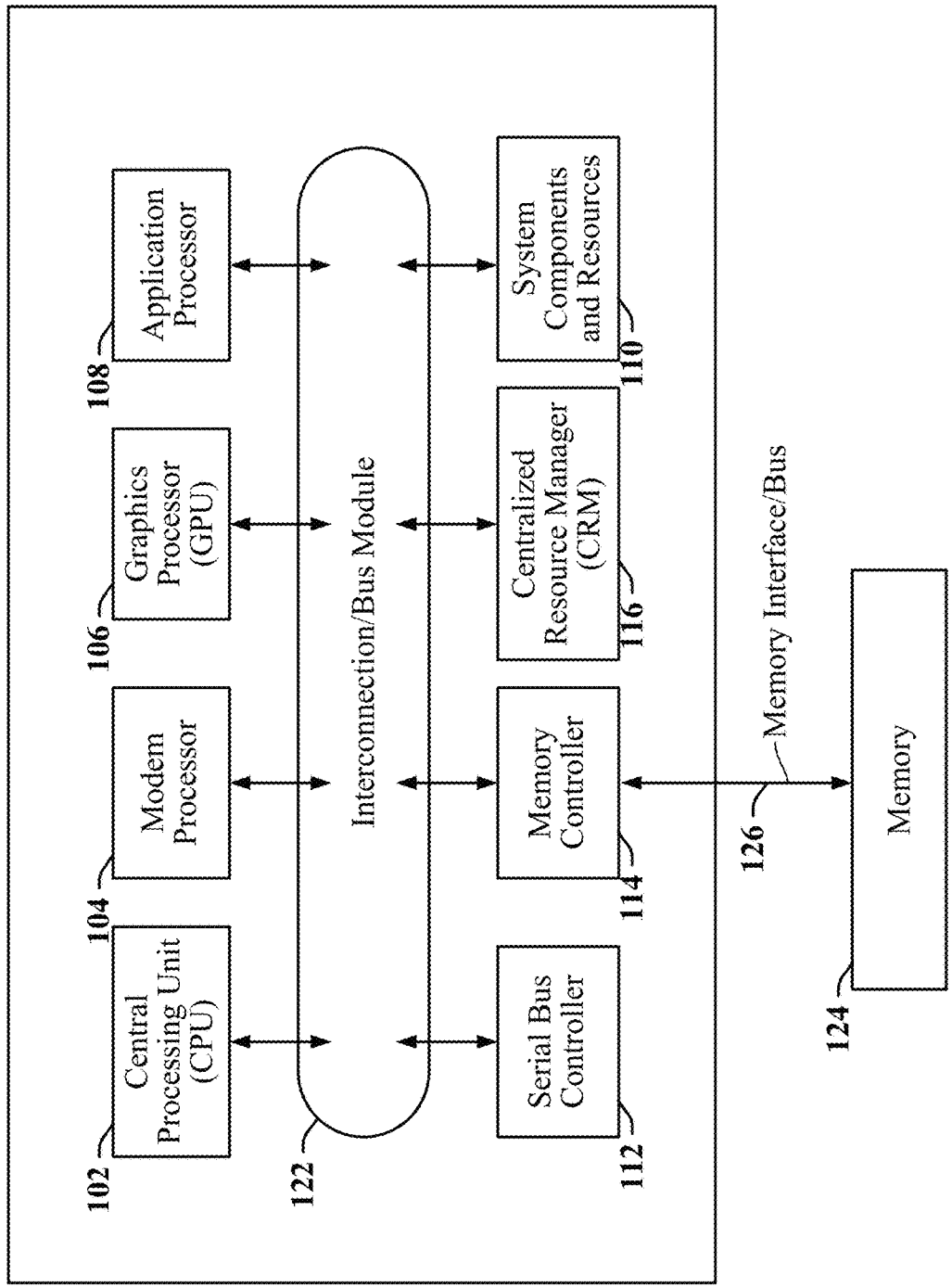
FIG. 1 illustrates an example of a system-on-a-chip in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, notebooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain aspects of the disclosure are applicable to serializer/deserializer (SERDES) circuits used to transmit and receive data over a serial communication link. SERDES circuits may be included in certain input/output (I/O) circuits. For example, SERDES circuits may be used in an IC device that provide an interface between core circuits and memory devices. Many mobile devices employ Synchronous Dynamic Random Access Memory (SDRAM), including Low-Power Double Data Rate (DDR) SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies.

FIG. 1 illustrates example components and interconnections in an SoC 100, including a memory interface/bus 126, that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via the memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
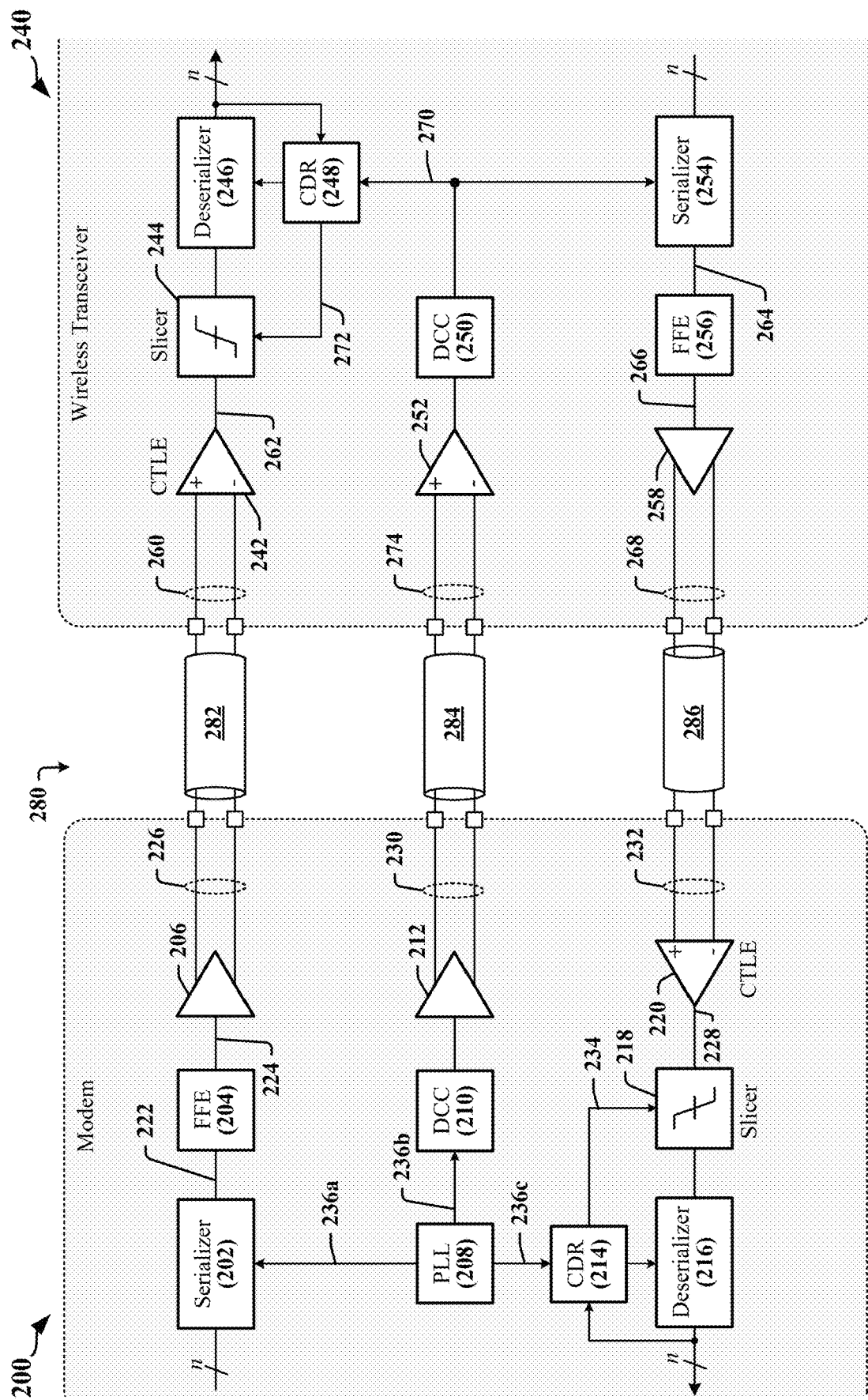
FIG. 2 illustrates an example of a system that employs a multi-channel data communication link.

FIG. 2 illustrates an example of a system that employs a multi-channel data communication link 280 to couple a modem 200 with a wireless transceiver 240. The data communication link 280 includes data channels 282 and 286 and a clock channel 284 that provide a transmission medium through which signals propagate between devices. In the illustrated example, a modem 200 transmits data in a first signal over a first data channel 282 to a wireless transceiver 240 and receives data in a second signal transmitted over a second data channel 286. Data signals are transmitted over the data channels 282 and 286 in accordance with timing information provided by a bus clock signal 230 transmitted over the clock channel 284.

The modem 200 may include a serializer 202 configured to convert n-bit parallel data elements, bytes or words into a serial data stream for transmission in a transmit data signal 222 over the first data channel 282. The transmit data signal 222 may be preconditioned by a pre-equalizing circuit, such as the illustrated digital feed-forward equalizer (the FFE 204), in order to combat or compensate for signal distortions attributable to inter-symbol interference (ISI), reflection and other effects that can be expected to limit bandwidth in first data channel 282. The preconditioned transmit data signal 224 output by the FFE 204 is provided to a driver circuit 206 that is configured drive the first data channel 282.

The modem 200 may include a serializer 202 configured to convert n-bit parallel data elements, bytes or words into a serial data stream for transmission in a serialized data signal 222. The serialized data signal 222 may be preconditioned by a pre-equalizing circuit, such as the illustrated digital feed-forward equalizer (the FFE 204), in order to combat or compensate for signal distortions attributable to inter-symbol interference (ISI), reflection and other effects that can be expected to limit bandwidth in the first data channel 282. A preconditioned data signal 224 output by the FFE 204 is provided to a driver circuit 206 that is configured generate and transmit a differential transmit data signal 226 over the first data channel 282.

The wireless transceiver 240 can be configured to process a data signal 260 received over the first data channel 282. The data signal 260 may be provided to a differential receiver 242, which may include or cooperate with an equalizing circuit. In one example, continuous time linear equalization (CTLE) may be used to compensate for certain losses experienced in the first data channel 282. The first data channel 282 may be characterized in some respects as a low-pass filter. In the illustrated example, the differential receiver 242 outputs an equalized data signal 262 that is sampled by a slicer 244. The slicer 244 may be implemented using a D-flipflop or the like and may be configured to capture signaling state of the equalized data signal 262 under the control of edges in a sampling clock signal 272 generated by a clock and data recovery (CDR) circuit 248. The output of the slicer 244 may be provided to a deserializer 246 that is clocked in accordance with one or more clock signals provided by the CDR circuit 248. The CDR circuit 248 may be configured to delay or phase shift a receiver clock signal 270 to ensure that edges in the sampling clock signal 272 are timed to optimize sampling reliability.

In the illustrated wireless transceiver 240, the receiver clock signal 270 is derived from a received bus clock signal 274 from the clock channel 284. A differential receiver 252 coupled to the clock channel 284 may be configured to equalize the received bus clock signal 274, and a duty cycle correction circuit 250 may be used to adjust the duty cycle of the receiver clock signal 270. The receiver clock signal 270 is provided to a serializer 254 that is configured to convert n-bit parallel data elements, bytes or words into a serial data stream for transmission in a serialized data signal 264. The serialized data signal 264 may be preconditioned by a pre-equalizing circuit, such as the illustrated FFE 256, in order to combat or compensate for signal distortions attributable to ISI, reflection and other effects that can be expected to limit bandwidth in the second data channel 286. A preconditioned data signal 266 output by the FFE 256 is provided to a driver circuit 258 that is configured generate and transmit a differential transmit data signal 268 over the second data channel 286.

The illustrated modem 200 can be configured to process a data signal 232 received over the second data channel 286. The data signal 232 may be provided to a differential receiver 220, which may include or cooperate with an equalizing circuit. In one example, CTLE may be used to compensate for certain losses experienced in the second data channel 286. The second data channel 286 may be characterized in some respects as a low-pass filter. In the illustrated example, the differential receiver 220 outputs an equalized data signal 228 that is sampled by a slicer 218. The slicer 218 may be implemented using a D-flipflop or the like and may be configured to capture signaling state of the equalized data signal 228 under the control of edges in a sampling clock signal 234 generated by a CDR circuit 214. The output of the slicer 218 may be provided to a deserializer 216 that is clocked in accordance with one or more clock signals provided by the CDR circuit 214. The CDR circuit 214 may be configured to delay or phase shift a transmitter clock signal to ensure that edges in the sampling clock signal 234 are timed to optimize sampling reliability.

A clock generation circuit, including the illustrated phase locked loop 208, may generate multiple clock signals 236a, 236b, 236c used by the modem 200. One or more of the clock signals 236a, 236b, 236c may be a divided version of a base clock signal generated by the PLL 208. One or more of the clock signals 236a, 236b, 236c may be phase shifted with respect to the base clock signal. In one example, the serializer 202 may produce the serialized data signal 222 using timing provided by a first clock signal 236a. In another example, the bus clock signal 230 transmitted over the clock channel 284 may be derived from a second clock signal 236b. In some instances, a duty cycle correction circuit 210 may be used to adjust the duty cycle of the second clock signal 236b and to provide an input to a driver circuit 212 that is configured drive the clock channel 284. In another example, the CDR circuit 248 may generate the sampling clock signal 234 from a third clock signal 236c.

Physical layer (PHY) circuits used to support data transmissions over the data communication link 280 may be implemented in multiple layers, slices and/or segments to enable the use of transistors rated for voltage and current levels that are less than the voltage and current levels specified for signaling over the data communication link 280. Multiple layers, slices and/or segments of physical layer circuits may be needed to match the impedance of the transmission lines of the data communication link 280. In some implementations, the physical layer circuits in the illustrated modem 200 and wireless transceiver 240 may be implemented in SoCs that provide multiple voltage domains in order to support low-voltage high-speed core circuits and higher-voltage high-power I/O circuits configured to drive the physical lines of the data communication link 280. For example, serializer and deserializer circuits may be incapable of directly driving the higher-power I/O circuits directly. In these and other examples, a chain of buffers is used to bridge the core circuits with I/O circuits.

Figure 3:
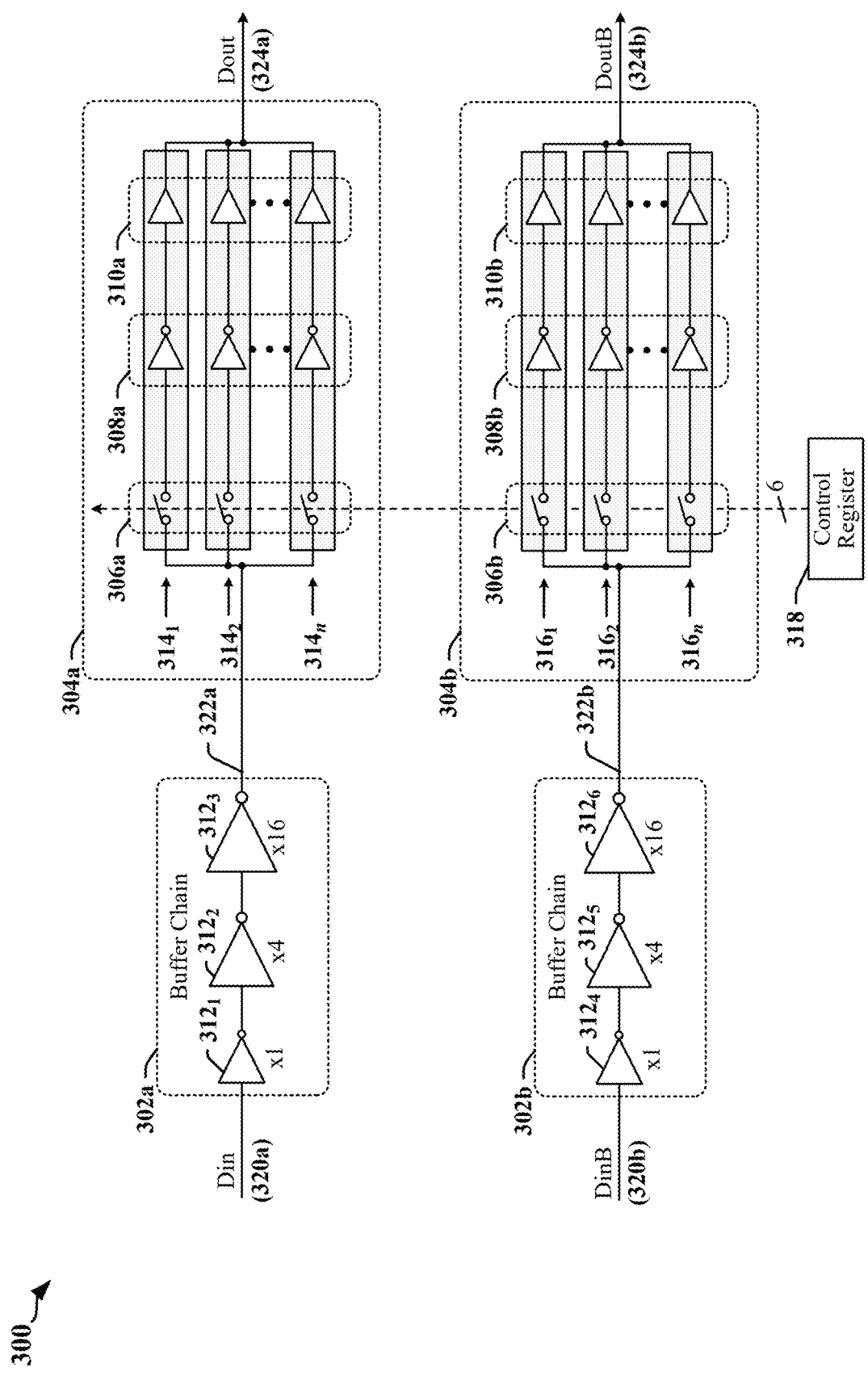
FIG. 3 illustrates a transmitter circuit that may be provided in an IC device that includes a wired data communication interface.

FIG. 3 illustrates an example of a transmitter circuit 300 that may be provided in an SoC that includes a wired data communication interface. In the illustrated example, each of a pair of complementary input data signals 320a, 320b of a differential data signal is provided to a respective processing path that includes amplification, buffer and conditioning circuits that can be configured to produce to a corresponding output data signal 324a, 324b. The output data signals 324a, 324b are complementary signals and together provide a differential signal that can be transmitted over the wired data communication interface.

The output data signals 324a, 324b are generated by respective driver circuits 304a, 304b that each comprise a number of driver segments. The driver segments are connected in parallel when activated, each driver segment receiving the same input signal or a version of the input signal and all activated driver segments contribute to the output of their respective driver circuit 304a or 304b. The driver segments are referenced herein as slices $314_1$-$314_n$, $316_1$-$316_n$. The number of slices $314_1$-$314_n$, $316_1$-$316_n$ that are activated may be selected to enable the driver circuits 304a, 304b to meet voltage, current and/or impedance specifications defined for the communication interface. In the illustrated example, two sets of switches 306a, 306b activate a combination of the slices $314_1$-$314_n$, $316_1$-$316_n$ to be coupled to buffered input signals 322a, 322b. In some instances, the outputs of inactive or deactivated slices $314_1$-$314_n$, $316_1$-$316_n$ are maintained in a high impedance state. In some instances, the driver circuits 304a, 304b may include additional switches that can couple the outputs of the activated slices $314_1$-$314_n$, $316_1$-$316_n$ to the output of the transmitter circuit 300.

The sets of switches 306a, 306b may be controlled or configured by a processor and/or by a control register 318 that has been configured by a processor. In the illustrated example, the control register 318 maintains a 6-bit code word that can be used to select a number of slices $314_1$-$314_n$, $316_1$-$316_n$ that are selected to be enabled. In one example, individual bits in the 6-bit code word control one switch in each of the sets of switches 306a, 306b. In another example, individual bits in the 6-bit code word control one switch in one of the sets of switches 306a, 306b. In another example, individual bits in the 6-bit code word control a group or combination of switches switch in each of the sets of switches 306a, 306b. In another example, individual bits in the 6-bit code word control a group or combination of switches switch in one of the sets of switches 306a, 306b. In another example, the 6-bit code word is decoded by logic circuits to cause one or more switches in the sets of switches 306a, 306b to activate or otherwise enable the desired number of slices $314_1$-$314_n$, $316_1$-$316_n$. The control register 318 may be configured during initialization or calibration procedures.

Each of the slices $314_1$-$314_n$, $316_1$-$316_n$ has a first stage 308a, 308b that includes at least one predriver circuit and a second stage 310a, 310b that includes a voltage mode driver. Multiple predriver circuits may be sequentially arranged within a slice $314_1$-$314_n$, $316_1$-$316_n$ in some implementations. The outputs of the voltage mode drivers in each active or enabled slice $314_1$-$314_n$, $316_1$-$316_n$ may be used to drive the corresponding output data signal 324a, 324b.

The illustrated transmitter circuit 300 includes buffer chains 302a, 302b that may be used to transition signals between voltage domains or to increase drive capability of the signals. In the illustrated example, the buffer chains 302a, 302b are implemented using scaled predrivers $314_1$-$314_6$. Voltage domains may be defined in an SoC as a grouping of circuits that are powered from a set of power rails that provide power at a specified voltage. In one example, core circuits in an SoC may reside within a first voltage domain while I/O circuits reside in a second, higher voltage domain. Circuits in the first voltage domain may be implemented using transistors with smaller gate geometries that transistors available for use within the second voltage domain. In some instances, a signal to be transmitted over a communication link may traverse multiple voltage domains. The buffer chains 302a, 302b may include certain predriver circuits, transient protection circuits, overvoltage protection circuits and the like.

In some implementations, the sets of switches 306a, 306b may be used to control an output impedance presented to a data communication channel by the outputs of the transmitter circuit 300. The output impedance may characterize the impedance at each output of the transmitter circuit 300 or the differential impedance of a pair of outputs. The sets of switches 306a, 306b are configured to couple or block the buffered input signals 322a, 322b from one or more slices $314_1$-$314_n$, $316_1$-$316_n$.

Figure 4:
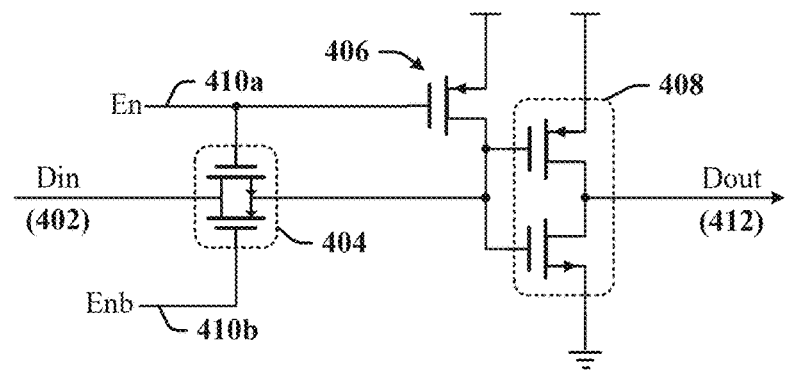
FIG. 4 illustrates examples of predriver circuits that may be used to implement the transmitter circuit illustrated in FIG. 3.
Figure 4:
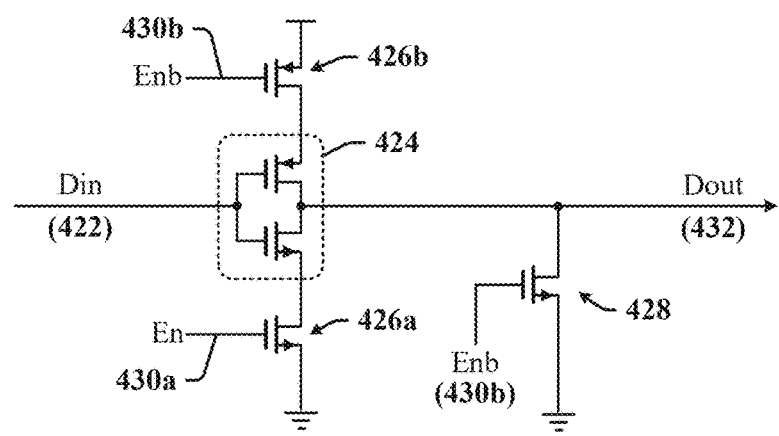

In some implementations, other switches may be provided to disable, decouple or define the output of predriver circuits of first stage 308a, 308b and/or voltage mode drivers of the second stage 310a, 310b in slices $314_1$-$314_n$, $316_1$-$316_n$. FIG. 4 illustrates examples of predriver circuits 400, 420 that may be used to implement predriver circuits of first stage 308a, 308b. In the first example, the predriver circuit 400 includes a pass gate circuit 404 and a control transistor 406 that are controlled by complementary enable signals 410a and 410b. The pass gate circuit 404 couples an input signal 402 to a push-pull transistor pair 408 when the enable signals 410a and 410b are in a first signaling state (the enabling state). The pass gate circuit 404 decouples the input signal 402 from the push-pull transistor pair 408 when the enable signals 410a and 410b are in a second signaling state (the disabling state). The control transistor 406 is turned on when the enable signals 410a, 410b are in the disabling state and turned off when the enable signals 410a, 410b are in the enabling state. In the illustrated example, the control transistor 406 causes the push-pull transistor pair 408 to pull the output 412 of the predriver circuit 400 to a logic high signaling state when turned on.

In the second example, the predriver circuit 420 includes three control transistors 426a, 426b and 428, each of which is controlled by one of the complementary enable signals 430a and 430b. A pair of the control transistors 426a, 426b is configured to enable a push-pull transistor pair 424 to propagate a data input signal 422 when the enable signals 430a and 430b are in a first signaling state (the enabling state). The control transistors 426a, 426b are further configured to disable the push-pull transistor pair 424 when the enable signals 430a and 430b are in a second signaling state (the disabling state). The third control transistor 428 is turned on when the enable signals 430a, 430b are in the disabling state and turned off when the enable signals 430a, 430b are in the enabling state. In the illustrated example, the third control transistor 428 pulls the output 432 of the predriver circuit 420 to a logic low signaling state when turned on.

In conventional interfaces, all of the scaled predrivers $314_1$-$314_6$ in both buffer chains 302a, 302b are active and toggling in response to the input data signals 320a, 320b regardless of the number of slices $314_1$-$314_n$, $316_1$-$316_n$ that are enabled. In some instances, the buffer chains 302a, 302b produce buffered input signals 322a, 322b that have more drive capability than needed for the number of slices $314_1$-$314_n$, $316_1$-$316_n$ that are enabled. In these instances, the buffer chains 302a, 302b consume a consistent and significant level of power, which may average to approximately 35% of the power consumed by the transmitter physical circuits.

In conventional interfaces, each switch in the sets of switches 306a, 306b is included in a signal path between the input data signals 320a, 320b and output data signals 324a, 324b, and signals are slowed due to the added capacitive load in the signal path. Fast signal transitions are typically needed to obtain adequate power supply rejection (PSR), and the inclusion of switching elements in the signal path may require increased device size and power consumption. PSR relates to the ability of the transmitter circuit 300 to suppress changes in the differential voltage between the output data signals 324a, 324b resulting from variations in power supply voltage.

Certain aspects of this disclosure relate to low-power, auto-scalable differential predriver circuits that can reduce power consumption of a transmitter and improve PSR. In some implementations, predriver circuits configured in accordance with certain aspects of this disclosure can provide average power reductions of 60% or more with respect to conventional predriver circuits. In some implementations, predriver circuits configured in accordance with certain aspects of this disclosure can improve PSR by at least 20% in high-power communication modes and at least 40% for low-power communication modes, with respect to conventional predriver circuits.

Figure 5:
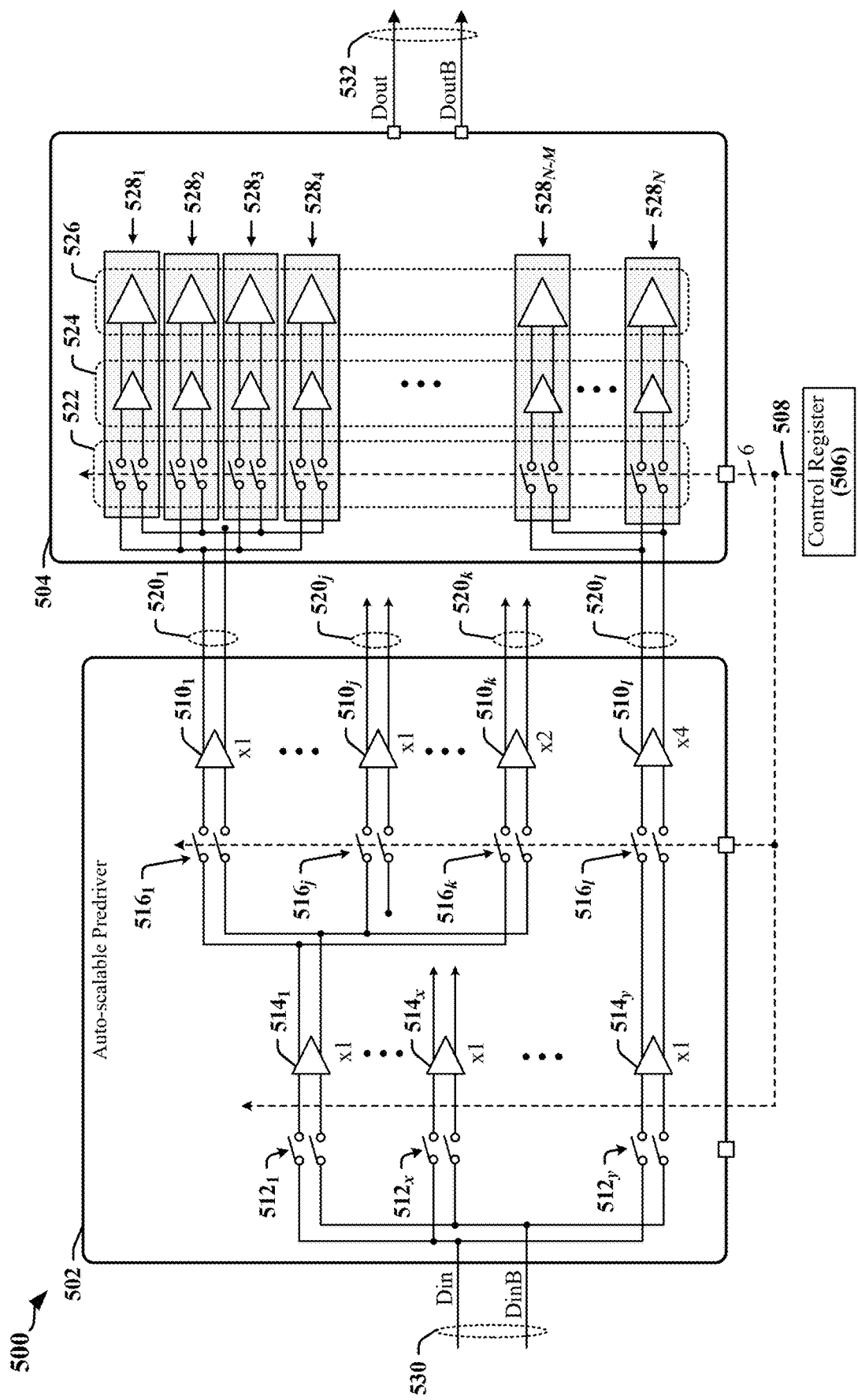
FIG. 5 illustrates an example of a differential transmitter circuit that includes an auto-scalable predriver provided in accordance with certain aspects of this disclosure.

FIG. 5 schematically illustrates an example of a differential transmitter circuit 500 that includes an auto-scalable predriver 502 in accordance with certain aspects of this disclosure. In one example, the differential transmitter circuit 500 may be provided in an SoC that includes a serial data communication interface. In the illustrated example, a differential data signal 530 is propagated through one or more processing paths, each path including amplification, buffering and/or conditioning circuits that can be configured to produce to a differential output 532. The differential output 532 can be coupled to the serial data communication interface.

The differential output 532 is generated by a driver circuit 504 that includes multiple driver segments or slices $528_1$-$528_N$ that can cooperate to drive the differential output 532 when enabled. The number of slices $528_1$-$528_N$ that are activated at any time may be selected to enable the driver circuit 504 to meet voltage, current and impedance specifications defined for the communication interface. In the illustrated example, a set of switches 522 can be used to select one or more of a group of slices $528_1$-$528_4$ to be enabled, activated or maintained in an active state. Each of the slices $528_1$-$528_N$ in the driver circuit 504 may receive one of multiple buffered differential input signals $528_1$-$528_i$ from the auto-scalable predriver 502 when activated or enabled. Activated or enabled slices $528_1$-$528_N$ contribute to the driving of an output of the driver circuit 504. The output of the driver circuit 504 may be coupled to the differential output 532.

The switches 522 may be controlled or configured by a processor and/or by a control register 506 that has been configured by a processor. In the illustrated example, the control register 506 maintains a code word 508 that includes 6 bits that are configured and used to enable or activate a selected number of the slices $528_1$-$528_N$. In other examples, the control register 506 maintains a code word 508 that has more than 6 bits or less than 6 bits. In some implementations, individual bits in the code word 508 control a single one of the switches 522. In some implementations, individual bits in the code word 508 control two or more of the switches 522. In some instances, each of the switches 522 is implemented using multiple switching devices that are controlled by one bit of the code word 508. The code word 508 may be decoded by logic circuits to control one or more of the switches 522 or associated switching devices in order to enable the desired number of slices $528_1$-$528_N$ in the driver circuit 504. The control register 506 may be configured during initialization or calibration procedures.

Each of the slices $528_1$-$528_N$ in the driver circuit 504 has a first stage 524 that includes at least one predriver circuit and a second stage 526 that includes a voltage mode driver. In some implementations, multiple predriver circuits are sequentially arranged within a slice $528_1$-$528_N$. The outputs of the voltage mode drivers in each active or enabled slice $528_1$-$528_N$ may be used to drive the differential output 532. Each of the slices $528_1$-$528_N$ has an input that is coupled to an output of the auto-scalable predriver 502.

According to certain aspects of this disclosure, the auto-scalable predriver 502 may be configured to provide branching buffer chains that can be automatically controlled by the code word 508 used to enable or activate a selected number of the slices $528_1$-$528_N$. The auto-scalable predriver 502 may be configured to provide the driver circuit 504 with multiple buffered input signals $520_1$-$520_i$ that can be coupled to different groupings of the slices $528_1$-$528_N$ in the driver circuit 504. In some instances, the buffered input signals $520_1$-$520_i$ are generated such that each buffered input signal $520_1$-$520_i$ is capable of driving a defined number of the slices $528_1$-$528_N$. In the illustrated example, a first buffered input signal $520_1$ is capable of driving at least four slices $528_1$-$528_4$ in the driver circuit 504, while a second buffered input signal $520_i$ is capable of driving, at a minimum, all of the slices $528_{N-M}$-$528_N$ in a different group of the slices $528_1$-$528_N$ in the driver circuit 504.

Each of the buffered input signals $520_1$-$520_i$ is provided by a corresponding output predriver $510_1$-$510_i$ that is individually configured to enable its output to drive at least the slices $528_1$-$528_N$ to which it is coupled. In the illustrated example, a first output predriver $510_1$ produces a first buffered input signal $520_1$ that is configured to drive at least four slices $528_1$-$528_4$ in the driver circuit 504. For the purposes of this disclosure only, the predriver $510_1$ in the first output predriver $510_1$ may be designated as having a unit slice driving capability. In the illustrated example, the predriver $510_j$ in a second illustrated output predriver $510_j$ also has unit slice driving capability and the predriver $510_k$ in a third illustrated output predriver $510_k$ is capable of driving twice as many of the slices $528_1$-$528_N$ as the first and second illustrated output predrivers $510_1$ and $510_j$. The predriver 510 in a fourth illustrated output predriver $510_l$ is capable of driving four times as many of the slices $528_1$-$528_N$ as the first and second illustrated output predrivers $510_1$ and $510_j$. The first, second and third output predrivers $510_1$, $510_j$ and $510_k$ are coupled to a first input predriver $514_1$ and the fourth output predriver $510_l$ is coupled to a second input predriver $514_y$.

In the illustrated example, each input predriver $514_1$-$514_y$ is capable of driving a minimum number of output predrivers. The drive capability of the input predrivers $514_1$-$514_y$ may be determined by a designer to optimize operation of the auto-scalable predriver 502. In one example, the drive capability of the input predrivers $514_1$-$514_y$ may be selected or configured to minimize the number of predriver circuits provided within the auto-scalable predriver 502. In another example, the drive capability of the input predrivers $514_1$-$514_y$ may be selected or configured to maximize switching speed of the auto-scalable predriver 502. In another example, the drive capability of the input predrivers $514_1$-$514_y$ may be selected or configured to minimize power consumption by the auto-scalable predriver 502, the driver circuit 504 and/or the differential transmitter circuit 500.

Each of the output predrivers $510_1$-$510_i$ and the input predrivers $514_1$-$514_y$ in the auto-scalable predriver 502 can be selectively enabled and disabled. A predriver $510_1$-$510_i$ or $514_1$-$514_y$ may be considered disabled when it does not propagate the differential data signal 530 or a propagate signal from the differential data signal 530. In the illustrated example, first switches $512_1$-$512_y$ can be used to disable the input predrivers $514_1$-$514_y$ and second switches $516_1$-$516_i$ can be used to disable the predrivers $510_1$-$510_i$ in the output predrivers $510_1$-$510_i$. In some implementations, each of the first switches $512_1$-$512_y$ and the second switches $516_1$-$516_i$ may make or break the signal path to or through a corresponding predriver $514_1$-$514_y$ or $510_1$-$510_i$. In some instances, the output of certain predrivers $514_1$-$514_y$ or $510_1$-$510_i$ may be forced to a predefined voltage state when the corresponding switch $512_1$-$512_y$ or $516_1$-$516_i$ is in an open state. In some implementations, an open switch $512_1$-$512_y$ or $516_1$-$516_i$ may cause one or more transistors in the corresponding predriver $514_1$-$514_y$ or $510_1$-$510_i$ to be decoupled from a power supply, causing the output of the corresponding predriver $514_1$-$514_y$ or $510_1$-$510_i$ to enter a high impedance state. A predriver $514_1$-$514_y$ or $510_1$-$510_i$ may consume negligible power when powered down or decoupled from an active input. In some implementations, power consumption can be reduced by 60% or more when the differential transmitter circuit 500 is operated in certain configurations.

The input predrivers $514_1$-$514_y$ and the output predrivers $510_1$-$510_l$ may be implemented using differential amplifiers with low parasitic resistances or capacitances. Parasitic effects can be reduced or minimized by deploying the switches $512_1$-$512_y$, $516_1$-$516_l$ and/or $522$ apart from the data signal path. Reducing parasitic effects can improve PSR jitter performance at low power. In some implementations, a pull-down switch is provided in the output predrivers $510_1$-$510_l$ to prevent small signal feedthrough when the output of an output predriver $510_1$-$510_l$ is in a high impedance state. In certain implementations, one or more intermediate predrivers (not shown) may be provided between the input predrivers $514_1$-$514_y$ and the output predrivers $510_1$-$510_l$. In some instances, a series of intermediate predrivers may be provided.

In one aspect of this disclosure, the first switches $512_1$-$512_y$ and the second switches $516_1$-$516_l$ can be controlled by the same code word 508 that controls the switches 522 in the driver circuit 504. The auto-scalable predriver 502 may be configured such that an active buffered input signal $520_1$-$520_l$ is coupled to each active or enabled slice $528_1$-$528_N$. In one example, switch $512_1$ and switch $516_1$ are closed when one or more of the group of slices $528_1$-$528_4$ is enabled, activated or in an active state. In some instances, other switches in the first switches $512_1$-$512_y$, the second switches $516_1$-$516_l$ and the switches 522 in the driver circuit 504 may be open, thereby minimizing power consumption in the differential transmitter circuit 500 for a given mode of operation.

In some implementations, the code word 508 may specify or indicate a number of the slices $528_1$-$528_N$ to be activated or enabled and decoding logic may be configured to select the minimum number of predrivers $514_1$-$514_y$ and/or $510_1$-$510_l$ to be enabled based on the value of the code word 508. In one example, the code word 508 may represent a binary value corresponding to the number of slices $528_1$-$528_N$ to be activated or enabled. One or more bits of the code word 508 may select a set of slices corresponding to the binary value of the bit, where each slice in the set of slices is coupled to an associated buffered input signal $520_1$-$520_l$. The codeword may also turn on the switches in the first switches $512_1$-$512_y$ and the second switches $516_1$-$516_l$ needed to couple the differential data signal 530 to the associated buffered input signal $520_1$-$520_l$.

Figure 6:
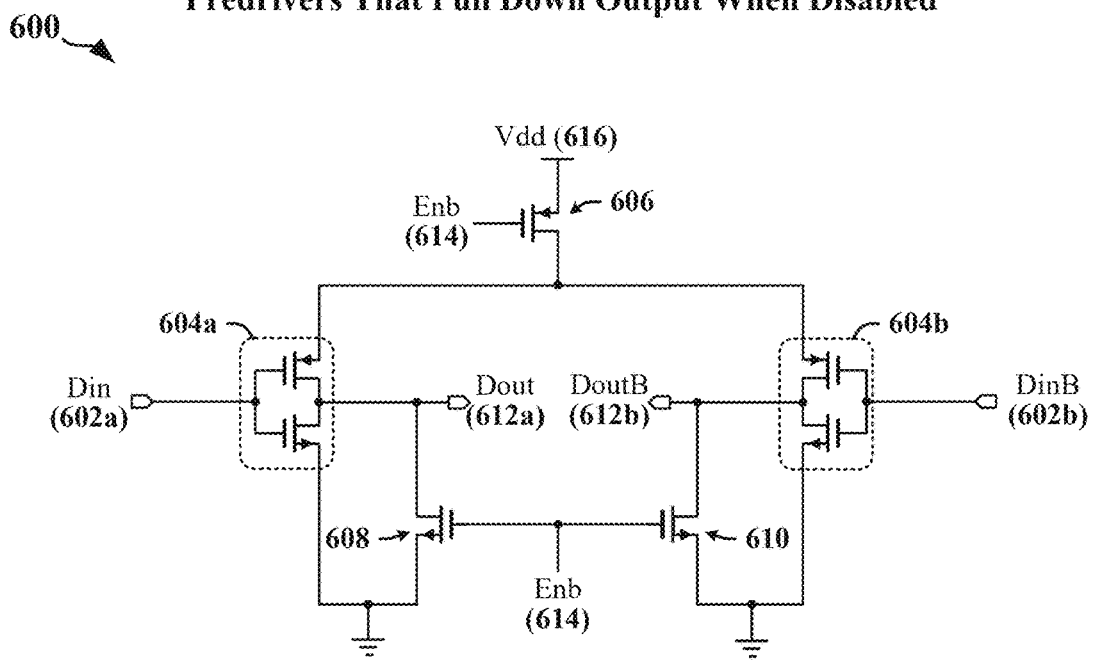
FIG. 6 illustrates first examples of predriver circuits that may be used in certain implementations of the auto-scalable predriver illustrated in FIG. 5.
Figure 6:
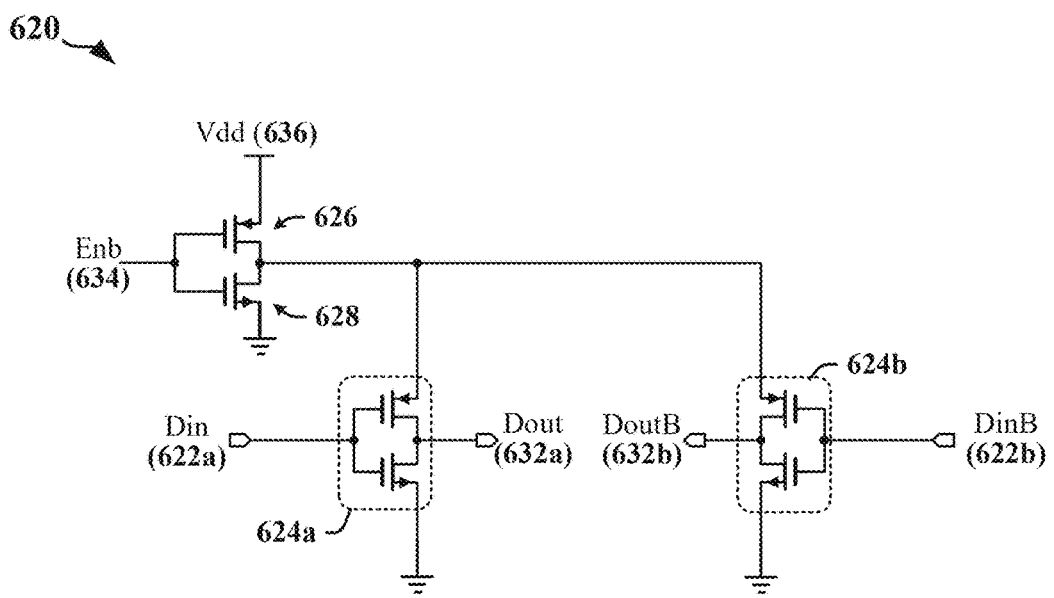

FIG. 6 illustrates first examples of predriver circuits 600, 620 that may be used in certain implementations of the auto-scalable predriver 502 illustrated in FIG. 5. In predriver circuit 600, complementary input signals 602a, 602b are provided to respective push-pull transistor pairs 604a, 604b, which drive the complementary output signals 612a, 612b. An inverse enable signal (Enb 614) drives the gates of three control transistors 606, 608, 610. The push-pull transistor pairs 604a, 604b are powered and active when Enb 614 is in a first signaling state (the enabling state). The complementary input signals 602a, 602b are propagated through corresponding push-pull transistor pairs 604a, 604b when Enb 614 is in the first signaling state. In the illustrated example, a pullup control transistor 606 couples the sources of the P-type metal-oxide-semiconductor (PMOS) transistors in the push-pull transistor pairs 604a, 604b to the high-voltage rail 616 of the power supply when Enb 614 is in the first signaling state. Two pulldown control transistors 608, 610 are turned off when Enb 614 is in the first signaling state.

The push-pull transistor pairs 604a, 604b are unpowered and inactive when Enb 614 is in a second signaling state (the disabling state). The complementary input signals 602a, 602b are blocked by the push-pull transistor pair 604a or 604b when Enb 614 is in the second signaling state. In the illustrated example, the pullup control transistor 606 is turned off and decouples the sources of the PMOS transistors in the push-pull transistor pairs 604a, 604b from the high-voltage rail 616 when Enb 614 is in the second signaling state. The pulldown control transistors 608, 610 are turned on when Enb 614 is in the second signaling state causing the complementary output signals 612a, 612b to be pulled to the low-voltage rail of the power supply (here, ground) while the push-pull transistor pairs 604a, 604b are disabled, unpowered or otherwise inactive due to the state of Enb 614.

In predriver circuit 620, complementary input signals 622a, 622b are provided to respective push-pull transistor pairs 624a, 624b, which drive the complementary output signals 632a, 632b. An inverse enable signal (Enb 634) drives the gates of two control transistors 626, 628. The push-pull transistor pairs 624a, 624b are powered and active when Enb 634 is in a first signaling state (the enabling state). The complementary input signals 622a, 622b are propagated through corresponding push-pull transistor pairs 624a, 624b when Enb 634 is in the first signaling state. In the illustrated example, a pullup control transistor 626 couples the sources of the PMOS transistors in the push-pull transistor pairs 624a, 624b to the high-voltage rail 636 of the power supply when Enb 634 is in the first signaling state. A pulldown control transistor 628 is turned off when Enb 634 is in the first signaling state.

The push-pull transistor pairs 624a, 624b are unpowered and inactive when Enb 634 is in a second signaling state (the disabling state). The complementary input signals 622a, 622b are blocked by the push-pull transistor pair 624a or 624b when Enb 634 is in the second signaling state. In the illustrated example, the pullup control transistor 626 is turned off and decouples the sources of the PMOS transistors in the push-pull transistor pairs 624a, 624b from the high-voltage rail 636 when Enb 634 is in the second signaling state. The pulldown control transistor 628 is turned on when Enb 634 is in the second signaling state causing the complementary output signals 632a, 632b to be pulled to the low-voltage rail of the power supply (here, ground) while the push-pull transistor pairs 624a, 624b are disabled, unpowered or otherwise inactive due to the state of Enb 634.

Figure 7:
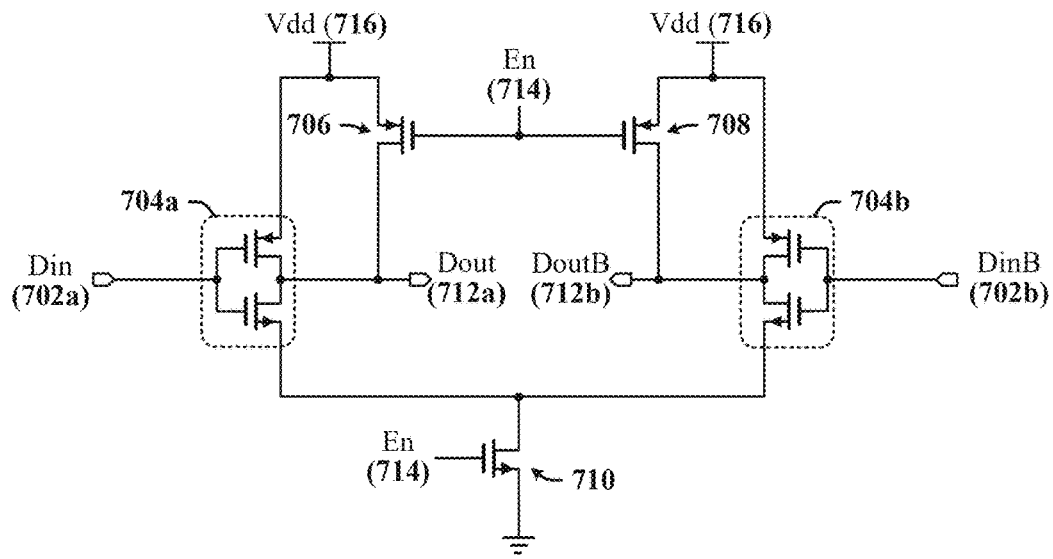
FIG. 7 illustrates second examples of predriver circuits that may be used in certain implementations of the auto-scalable predriver illustrated in FIG. 5.
Figure 7:
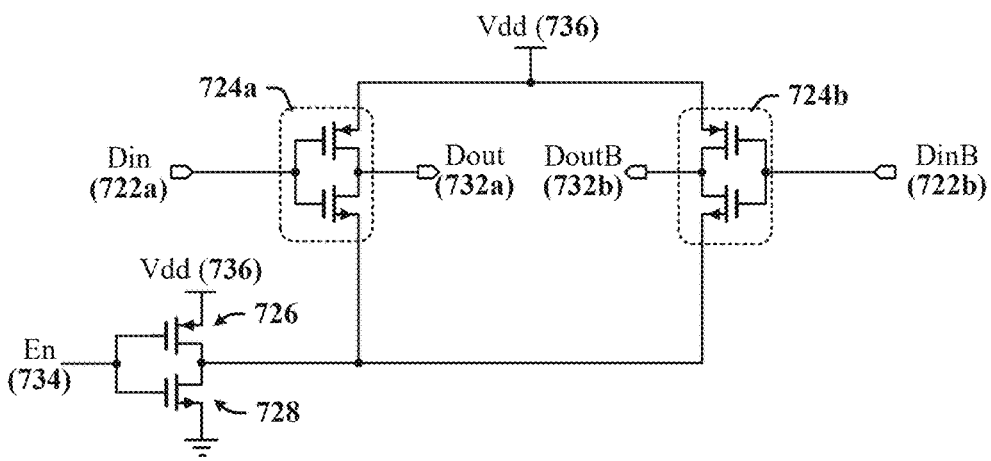

FIG. 7 illustrates second examples of predriver circuits 700, 720 that may be used in certain implementations of the auto-scalable predriver 502 illustrated in FIG. 5. In predriver circuit 700, complementary input signals 702a, 702b are provided to respective push-pull transistor pairs 704a, 704b, which drive the complementary output signals 712a, 712b. An enable signal (En 714) drives the gates of three control transistors 706, 708, 710. The push-pull transistor pairs 704a, 704b are powered and active when En 714 is in a first signaling state (the enabling state). The complementary input signals 702a, 702b are propagated through corresponding push-pull transistor pairs 704a or 704b when En 714 is in the first signaling state. In the illustrated example, a pulldown control transistor 710 couples the sources of the N-type metal-oxide-semiconductor (NMOS) transistors in the push-pull transistor pairs 704a, 704b to the low-voltage rail of the power supply (here, ground) when En 714 is in the first signaling state. Two pullup control transistors 706, 708 are turned off when En 714 is in the first signaling state.

The push-pull transistor pairs 704a, 704b are unpowered and inactive when En 714 is in a second signaling state (the disabling state). The complementary input signals 702a, 702b are blocked by the push-pull transistor pair 704a or 704b when En 714 is in the second signaling state. In the illustrated example, the pulldown control transistor 710 decouples the sources of the NMOS transistors in the push-pull transistor pairs 704a, 704b from the low-voltage rail of the power supply when En 714 is in the second signaling state. The pullup control transistors 706, 708 are turned on when En 714 is in the second signaling state causing the complementary output signals 712a, 712b to be pulled to the higher-voltage rail of the power supply (here, Vdd 716) while the push-pull transistor pairs 704a, 704b are disabled, unpowered or otherwise inactive due to the operation of En 714.

In predriver circuit 720, complementary input signals 722a, 722b are provided to respective push-pull transistor pairs 724a, 724b, which drive the complementary output signals 732a, 732b. An enable signal (En 734) drives the gates of two control transistors 726, 728. The push-pull transistor pairs 724a, 724b are powered and active when En 734 is in a first signaling state (the enabling state). The complementary input signals 722a, 722b are propagated through corresponding push-pull transistor pairs 724a, 724b when En 734 is in the first signaling state. In the illustrated example, a pulldown control transistor 728 couples the sources of the NMOS transistors in the push-pull transistor pairs 724a, 724b to the low-voltage rail of the power supply (here, ground) when En 734 is in the first signaling state. A pullup control transistor 726 is turned off when En 734 is in the first signaling state.

The push-pull transistor pairs 724a, 724b are unpowered and inactive when En 734 is in a second signaling state (the disabling state). The complementary input signals 722a, 722b are blocked by the push-pull transistor pair 724a or 724b when En 734 is in the second signaling state. In the illustrated example, the pulldown control transistor 728 is turned off and decouples the sources of the PMOS transistors in the push-pull transistor pairs 724a, 724b from the low-voltage rail when En 734 is in the second signaling state. The pullup control transistor 726 is turned on when En 734 is in the second signaling state causing the complementary output signals 732a, 732b to be pulled to the high-voltage rail (here, Vdd 736) of the power supply while the push-pull transistor pairs 724a, 724b are disabled, unpowered or otherwise inactive due to the state of En 734.

A transmitter circuit configured in accordance with certain aspects of this disclosure may be coupled to a data communication link. The transmitter circuit may have multiple driver slices coupled to an output of the transmitter circuit and multiple buffer circuits. Each driver slice may include a first differential predriver and a first switch that may be configured to selectively enable and disable the first differential predriver of its respective driver slice based on a configuration of a control code provided to the transmitter circuit.

Each driver slice may include a differential voltage driver having an output coupled to the output of the transmitter circuit and an input coupled to an output of the first differential predriver in the each driver slice.

A second differential predriver may be configured to provide a first differential buffered data signal to inputs of a first group of driver slices when the second differential predriver is enabled. A second switch may be configured to enable the second differential predriver when one or more bits of the control code are configured to enable the first differential predriver in at least one driver slice in the first group of driver slices.

A third differential predriver may be configured to provide a second differential buffered data signal to inputs of each of a second group of driver slices when the third differential predriver is enabled. A third switch may be configured to enable the third differential predriver when one or more bits of the control code are configured to enable the first differential predriver in at least one driver slice in the second group of driver slices.

In some implementations, each driver slice in the first group of driver slices is excluded from the second group of driver slices. In some implementations, the first group of driver slices includes more of the driver slices than the second group of driver slices.

The transmitter circuit may have a fourth differential predriver that is configured to propagate a differential input data signal to the second differential predriver when the fourth differential predriver is enabled. A fourth switch may be configured to enable the fourth differential predriver when a first differential predriver in at least one driver slice in the first group of driver slices is enabled. In one example, the fourth differential predriver is further configured to propagate the differential input data signal to the third differential predriver when a first differential predriver in at least one driver slice in the second group of driver slices is enabled. In another example, a fifth differential predriver is configured to propagate the differential input data signal to the third differential predriver when the fifth differential predriver is enabled. A fifth switch may be configured to enable the fifth differential predriver when a first differential predriver in at least one driver slice in the second group of driver slices is enabled. The fourth differential predriver may be configured to propagate the differential input data signal to a first set of buffer circuits that includes the second differential predriver. The fifth differential predriver may be configured to propagate the differential input data signal to a second set of buffer circuits that includes the third differential predriver. In some instances, the second set of buffer circuits includes more buffer circuits than the first set of buffer circuits.

Figure 8:
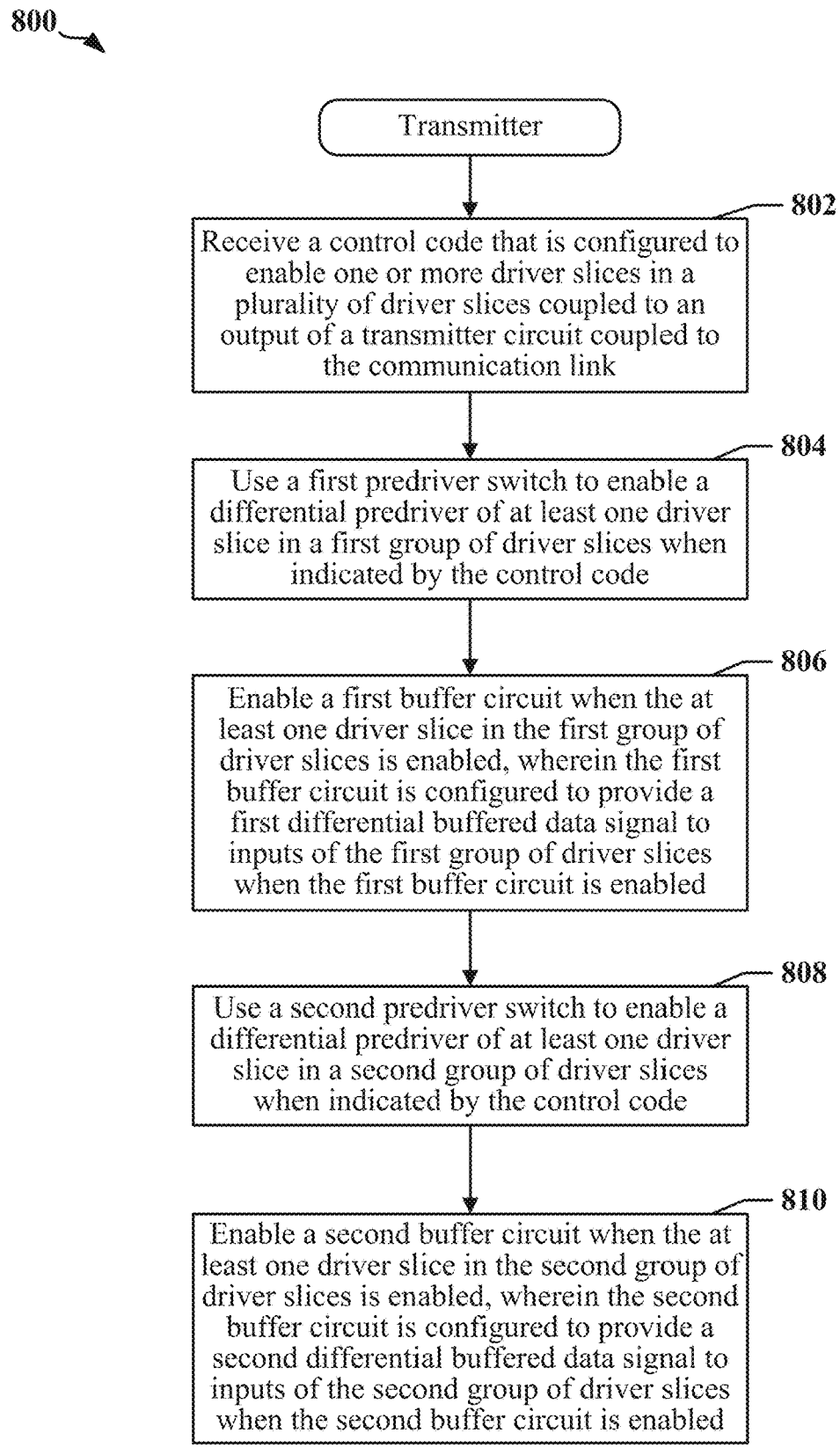
FIG. 8 is a flow diagram illustrating an example of a method for transmitting a data signal over a communication link in accordance with certain aspects disclosed herein.

FIG. 8 is a flow diagram illustrating an example of a method 800 for transmitting a data signal over a communication link in accordance with certain aspects disclosed herein. In one example, the method 800 is implemented in a transmitter coupled to a transmission line. At block 802, a control code is received. The control code may be configured to enable one or more driver slices in a plurality of driver slices coupled to an output of a transmitter circuit coupled to the communication link. The term "driver slice" may be used herein to reference an amplification circuit that is one of multiple amplification circuits that can be contribute to an output of the transmitter. Each driver slice is configured to receive a buffered version of a data signal when enabled. The amplification circuit may alternatively be referred to as a driver segment or layer. The control code may be represented by a multibit code word, such as the 6-bit code word described in reference to FIGS. 3 and 5.

At block 804, a first switch may be used to enable the first differential predriver of at least one driver slice in a first group of driver slices when indicated by the control code. In one example, the at least one driver slice in the first group of driver slices may be enabled when the first switch is activated or closed. In another example, the at least one driver slice in the first group of driver slices may be enabled when the first switch is inactive or open. At block 806, a second differential predriver is enabled when at least one driver slice in the first group of driver slices is enabled. The second differential predriver may be configured to provide a first differential buffered data signal to inputs of the first group of driver slices when the second differential predriver is enabled.

At block 808, a second first switch may be used to enable the first differential predriver of at least one driver slice in a second group of driver slices when indicated by the control code. In one example, the at least one driver slice in the second group of driver slices may be enabled when the second first switch is activated or closed. In another example, the at least one driver slice in the second group of driver slices may be enabled when the second first switch is inactive or open. At block 810, a third differential predriver may be enabled when the at least one driver slice in the second group of driver slices is enabled. The third differential predriver may be configured to provide a second differential buffered data signal to inputs of the second group of driver slices when the third differential predriver is enabled. Each driver slice may include a differential voltage driver having an output coupled to the output of the transmitter circuit and an input coupled to an output of the first differential predriver in the each driver slice.

In some implementations, each driver slice in the first group of driver slices is excluded from the second group of driver slices. In some implementations, the first group of driver slices includes more of the driver slices than the second group of driver slices.

In certain implementations, a differential input data signal is propagated to the second differential predriver when a fourth differential predriver is enabled. The fourth differential predriver may be enabled when a first differential predriver in at least one driver slice in the first group of driver slices is enabled. In one example, the differential input data signal is also propagated to the third differential predriver when a first differential predriver in at least one driver slice in the second group of driver slices is enabled. In another example, the differential input data signal is propagated to the third differential predriver when a fifth differential predriver is enabled. The fifth differential predriver may be enabled when a first differential predriver in at least one driver slice in the second group of driver slices is enabled. The fourth differential predriver may be configured to propagate the differential input data signal to a first set of buffer circuits that includes the second differential predriver and the fifth differential predriver may be configured to propagate the differential input data signal to a second set of buffer circuits that includes the third differential predriver. In some instances, the second set of buffer circuits includes more buffer circuits than the first set of buffer circuits.

In some implementations, pulldown transistors coupled to outputs of at least one driver slice are turned on when the first differential predriver of the at least one driver slice is disabled. In some implementations, pullup transistors coupled to outputs of at least one driver slice are turned on when the first differential predriver of the at least one driver slice is disabled.

The operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus includes means for enabling first differential predrivers in driver slices when indicated by a control code and means for enabling buffer circuits when indicated by the control code. The means for enabling first differential predrivers in driver slices may include a first switch that is configured to enable the first differential predriver of a first driver slice provided in a first group of driver slices, and a second first switch that is configured to enable the first differential predriver of a second driver slice provided in a first group of driver slices. The means for enabling buffer circuits when indicated by the control code may include a second differential predriver that is enabled when the first driver slice is enabled and a third differential predriver that is enabled when the second driver slice is enabled. The second differential predriver may be configured to provide a first differential buffered data signal to inputs of the first group of driver slices when the second differential predriver is enabled. The third differential predriver may be configured to provide a second differential buffered data signal to inputs of the second group of driver slices when the third differential predriver is enabled. Each driver slice may include a differential voltage driver having an output coupled to the output of the transmitter circuit and an input coupled to an output of the first differential predriver in the each driver slice.

In some implementations, each driver slice in the first group of driver slices is excluded from the second group of driver slices. In some implementations, the first group of driver slices includes more of the driver slices than the second group of driver slices.

In certain implementations, a fourth differential predriver is configured to propagate a differential input data signal to the second differential predriver when the fourth differential predriver is enabled. The fourth differential predriver may be enabled when a first differential predriver in at least one driver slice in the first group of driver slices is enabled. In one example, the fourth differential predriver may be further configured to propagate the differential input data signal to the third differential predriver when a first differential predriver in at least one driver slice in the second group of driver slices is enabled. In another example, a fifth differential predriver may be configured to propagate the differential input data signal to the third differential predriver when the fifth differential predriver is enabled. The fifth differential predriver may be enabled when a first differential predriver in at least one driver slice in the second group of driver slices is enabled. The fourth differential predriver may be configured to propagate the differential input data signal to a first set of buffer circuits that includes the second differential predriver. The fifth differential predriver may be configured to propagate the differential input data signal to a second set of buffer circuits that includes the third differential predriver. In some instances, the second set of buffer circuits includes more buffer circuits than the first set of buffer circuits.

In certain implementations, the apparatus includes means for driving an output of the transmitter circuit. The means for driving the output of the transmitter circuit may include differential voltage drivers in the driver slices. Each differential voltage driver may have an output coupled to the output of the transmitter circuit and an input coupled to an output of the first differential predriver in its driver slice.

In some implementations, pulldown transistors coupled to outputs of at least one driver slice are turned on when the first differential predriver of the at least one driver slice is disabled. In some implementations, pullup transistors coupled to outputs of at least one driver slice are turned on when the first differential predriver of the at least one driver slice is disabled.

Some implementation examples are described in the following numbered clauses:

1. A transmitter circuit coupled to a data communication link, comprising: driver slices coupled to an output of the transmitter circuit, each driver slice comprising: a first differential predriver; and a first switch that is configured to selectively enable and disable the first differential predriver of the each driver slice based on a configuration of a control code provided to the transmitter circuit; a second differential predriver that is configured to provide a first differential buffered data signal to inputs of a first group of driver slices when the second differential predriver is enabled; a second switch configured to enable the second differential predriver when one or more bits of the control code are configured to enable the first differential predriver in at least one driver slice in the first group of driver slices; a third differential predriver that is configured to provide a second differential buffered data signal to inputs of each of a second group of driver slices when the third differential predriver is enabled; and a third switch configured to enable the third differential predriver when one or more bits of the control code are configured to enable the first differential predriver in at least one driver slice in the second group of driver slices.

2. The transmitter circuit as described in clause 1, wherein each driver slice in the first group of driver slices is excluded from the second group of driver slices.

3. The transmitter circuit as described in clause 1 or clause 2, wherein the first group of driver slices includes more of the driver slices than the second group of driver slices.

4. The transmitter circuit as described in any of clauses 1-3, further comprising: a fourth differential predriver that is configured to propagate a differential input data signal to the second differential predriver when the fourth differential predriver is enabled; and a fourth switch configured to enable the fourth differential predriver when a first differential predriver in at least one driver slice in the first group of driver slices is enabled.

5. The transmitter circuit as described in clause 4, wherein the fourth differential predriver is further configured to propagate the differential input data signal to the third differential predriver when a first differential predriver in at least one driver slice in the second group of driver slices is enabled.

6. The transmitter circuit as described in clause 4, further comprising: a fifth differential predriver that is configured to propagate the differential input data signal to the third differential predriver when the fifth differential predriver is enabled; and a fifth switch configured to enable the fifth differential predriver when a first differential predriver in at least one driver slice in the second group of driver slices is enabled.

7. The transmitter circuit as described in clause 6, wherein the fourth differential predriver is configured to propagate the differential input data signal to a first set of buffer circuits that includes the second differential predriver and the fifth differential predriver is configured to propagate the differential input data signal to a second set of buffer circuits that includes the third differential predriver, wherein the second set of buffer circuits includes more buffer circuits than the first set of buffer circuits, and wherein at least one buffer in the transmitter circuit is disabled when the first set of buffer circuits or the second set of buffer circuits is enabled.

8. The transmitter circuit as described in any of clauses 1-7, wherein each driver slice further comprises: a differential voltage driver having an output coupled to the output of the transmitter circuit and an input coupled to an output of the first differential predriver in the each driver slice.

9. The transmitter circuit as described in any of clauses 1-8, further comprising: pulldown transistors coupled to outputs of at least one driver slice, wherein the pulldown transistors are turned on when the first differential predriver of the at least one driver slice is disabled.

10. The transmitter circuit as described in any of clauses 1-9, further comprising: pullup transistors coupled to outputs of at least one driver slice, wherein the pullup transistors are turned on when the first differential predriver of the at least one driver slice is disabled.

11. An apparatus comprising: means for enabling first differential predrivers in driver slices when indicated by a control code, including: a first switch that is configured to enable the first differential predriver of a first driver slice provided in a first group of driver slices, and a second first switch that is configured to enable the first differential predriver of a second driver slice provided in a second group of driver slices; and means for enabling buffer circuits when indicated by the control code, including: a second differential predriver that is enabled when the first driver slice is enabled, wherein the second differential predriver is configured to provide a first differential buffered data signal to inputs of the first group of driver slices when the second differential predriver is enabled, and a third differential predriver that is enabled when the second driver slice is enabled, wherein the third differential predriver is configured to provide a second differential buffered data signal to inputs of the second group of driver slices when the third differential predriver is enabled.

12. The apparatus as described in clause 11, wherein each driver slice in the first group of driver slices is excluded from the second group of driver slices.

13. The apparatus as described in clause 11 or clause 12, wherein the first group of driver slices includes more of the driver slices than the second group of driver slices.

14. The apparatus as described in any of clauses 11-13, wherein a fourth differential predriver is configured to propagate a differential input data signal to the second differential predriver when the fourth differential predriver is enabled, and wherein the fourth differential predriver is enabled when a first differential predriver in at least one driver slice in the first group of driver slices is enabled.

15. The apparatus as described in clause 14, wherein the fourth differential predriver is further configured to propagate the differential input data signal to the third differential predriver when a first differential predriver in at least one driver slice in the second group of driver slices is enabled.

16. The apparatus as described in clause 14, wherein a fifth differential predriver is configured to propagate the differential input data signal to the third differential predriver when the fifth differential predriver is enabled, wherein the fifth differential predriver is enabled when a first differential predriver in at least one driver slice in the second group of driver slices is enabled.

17. The apparatus as described in clause 16, wherein the fourth differential predriver is configured to propagate the differential input data signal to a first set of buffer circuits that includes the second differential predriver and the fifth differential predriver is configured to propagate the differential input data signal to a second set of buffer circuits that includes the third differential predriver, wherein the second set of buffer circuits includes more buffer circuits than the first set of buffer circuits, and wherein at least one buffer in the apparatus is disabled when the first set of buffer circuits or the second set of buffer circuits is enabled.

18. The apparatus as described in any of clauses 11-17, further comprising: means for driving an output of the apparatus, including differential voltage drivers in the driver slices, wherein each differential voltage driver has an output coupled to the output of the apparatus and an input coupled to an output of the first differential predriver in its driver slice.

19. The apparatus as described in any of clauses 11-18, further comprising: pulldown transistors coupled to outputs of at least one driver slice, wherein the pulldown transistors are turned on when the first differential predriver of the at least one driver slice is disabled.

20. The apparatus as described in any of clauses 11-19, further comprising: pullup transistors coupled to outputs of at least one driver slice, wherein the pullup transistors are turned on when the first differential predriver of the at least one driver slice is disabled.

21. A method for transmitting a data signal over a communication link, comprising: receiving a control code that is configured to enable one or more driver slices in a plurality of driver slices coupled to an output of a transmitter circuit coupled to the communication link; using a first switch to enable the first differential predriver of at least one driver slice in a first group of driver slices when indicated by the control code; enabling a second differential predriver when the at least one driver slice in the first group of driver slices is enabled, wherein the second differential predriver is configured to provide a first differential buffered data signal to inputs of the first group of driver slices when the second differential predriver is enabled; using a second first switch to enable the first differential predriver of at least one driver slice in a second group of driver slices when indicated by the control code; and enabling a third differential predriver when the at least one driver slice in the second group of driver slices is enabled, wherein the third differential predriver is configured to provide a second differential buffered data signal to inputs of the second group of driver slices when the third differential predriver is enabled.

22. The method as described in clause 21, wherein each driver slice in the first group of driver slices is excluded from the second group of driver slices.

23. The method as described in clause 21 or clause 22, wherein the first group of driver slices includes more of the driver slices than the second group of driver slices.

24. The method as described in any of clauses 21-23, further comprising: propagating a differential input data signal to the second differential predriver when a fourth differential predriver is enabled, wherein the fourth differential predriver is enabled when a first differential predriver in at least one driver slice in the first group of driver slices is enabled.

25. The method as described in clause 24, further comprising: propagating the differential input data signal to the third differential predriver when a first differential predriver in at least one driver slice in the second group of driver slices is enabled.

26. The method as described in clause 24, further comprising: propagating the differential input data signal to the third differential predriver when a fifth differential predriver is enabled, wherein the fifth differential predriver is enabled when a first differential predriver in at least one driver slice in the second group of driver slices is enabled.

27. The method as described in clause 26, wherein the fourth differential predriver is configured to propagate the differential input data signal to a first set of buffer circuits that includes the second differential predriver and the fifth differential predriver is configured to propagate the differential input data signal to a second set of buffer circuits that includes the third differential predriver, wherein the second set of buffer circuits includes more buffer circuits than the first set of buffer circuits, and wherein at least one buffer in the transmitter circuit is disabled when the first set of buffer circuits or the second set of buffer circuits is enabled.

28. The method as described in any of clauses 21-27, wherein each driver slice comprises a differential voltage driver having an output coupled to the output of the transmitter circuit and an input coupled to an output of the first differential predriver in the each driver slice.

29. The method as described in any of clauses 21-28, wherein pulldown transistors coupled to outputs of at least one driver slice are turned on when the first differential predriver of the at least one driver slice is disabled.

30. The method as described in any of clauses 21-29, wherein pullup transistors coupled to outputs of at least one driver slice are turned on when the first differential predriver of the at least one driver slice is disabled.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A transmitter circuit coupled to a data communication link, comprising:
   driver slices coupled to an output of the transmitter circuit, each driver slice comprising:
     a first differential predriver; and
     a first switch that is configured to selectively enable and disable the first differential predriver of the each driver slice based on a configuration of a control code provided to the transmitter circuit;
   a second differential predriver that is configured to provide a first differential buffered data signal to inputs of a first group of driver slices when the second differential predriver is enabled;
   a second switch configured to enable the second differential predriver when one or more bits of the control code are configured to enable the first differential predriver in at least one driver slice in the first group of driver slices;
   a third differential predriver that is configured to provide a second differential buffered data signal to inputs of each of a second group of driver slices when the third differential predriver is enabled; and
   a third switch configured to enable the third differential predriver when one or more bits of the control code are configured to enable the first differential predriver in at least one driver slice in the second group of driver slices.

2. The transmitter circuit of claim 1, wherein each driver slice in the first group of driver slices is excluded from the second group of driver slices.

3. The transmitter circuit of claim 1, wherein the first group of driver slices includes more of the driver slices than the second group of driver slices.

4. The transmitter circuit of claim 1, further comprising:
   a fourth differential predriver that is configured to propagate a differential input data signal to the second differential predriver when the fourth differential predriver is enabled; and
   a fourth switch configured to enable the fourth differential predriver when a first differential predriver in at least one driver slice in the first group of driver slices is enabled.

5. The transmitter circuit of claim 4, wherein the fourth differential predriver is further configured to propagate the differential input data signal to the third differential predriver when a first differential predriver in at least one driver slice in the second group of driver slices is enabled.

6. The transmitter circuit of claim 4, further comprising:
   a fifth differential predriver that is configured to propagate the differential input data signal to the third differential predriver when the fifth differential predriver is enabled; and
   a fifth switch configured to enable the fifth differential predriver when a first differential predriver in at least one driver slice in the second group of driver slices is enabled.

7. The transmitter circuit of claim 6, wherein the fourth differential predriver is configured to propagate the differential input data signal to a first set of buffer circuits that includes the second differential predriver and the fifth differential predriver is configured to propagate the differential input data signal to a second set of buffer circuits that includes the third differential predriver, wherein the second set of buffer circuits includes more buffer circuits than the first set of buffer circuits, and wherein at least one buffer in the transmitter circuit is disabled when the first set of buffer circuits or the second set of buffer circuits is enabled.

8. The transmitter circuit of claim 1, wherein each driver slice further comprises:
   a differential voltage driver having an output coupled to the output of the transmitter circuit and an input coupled to an output of the first differential predriver in the each driver slice.

9. The transmitter circuit of claim 1, further comprising:
   pulldown transistors coupled to outputs of at least one driver slice, wherein the pulldown transistors are turned on when the first differential predriver of the at least one driver slice is disabled.

10. The transmitter circuit of claim 1, further comprising:
    pullup transistors coupled to outputs of at least one driver slice, wherein the pullup transistors are turned on when the first differential predriver of the at least one driver slice is disabled.

11. An apparatus comprising:
    means for enabling first differential predrivers in driver slices when indicated by a control code, including:
      a first switch that is configured to enable the first differential predriver of a first driver slice provided in a first group of driver slices, and
      a second first switch that is configured to enable the first differential predriver of a second driver slice provided in a second group of driver slices; and
    means for enabling buffer circuits when indicated by the control code, including:
      a second differential predriver that is enabled when the first driver slice is enabled, wherein the second differential predriver is configured to provide a first differential buffered data signal to inputs of the first group of driver slices when the second differential predriver is enabled, and
      a third differential predriver that is enabled when the second driver slice is enabled, wherein the third differential predriver is configured to provide a second differential buffered data signal to inputs of the second group of driver slices when the third differential predriver is enabled.

12. The apparatus of claim 11, wherein each driver slice in the first group of driver slices is excluded from the second group of driver slices.

13. The apparatus of claim 11, wherein the first group of driver slices includes more of the driver slices than the second group of driver slices.

14. The apparatus of claim 11, wherein a fourth differential predriver is configured to propagate a differential input data signal to the second differential predriver when the fourth differential predriver is enabled, and wherein the fourth differential predriver is enabled when a first differential predriver in at least one driver slice in the first group of driver slices is enabled.

15. The apparatus of claim 14, wherein the fourth differential predriver is further configured to propagate the differential input data signal to the third differential predriver when a first differential predriver in at least one driver slice in the second group of driver slices is enabled.

16. The apparatus of claim 14, wherein a fifth differential predriver is configured to propagate the differential input data signal to the third differential predriver when the fifth differential predriver is enabled, wherein the fifth differential predriver is enabled when a first differential predriver in at least one driver slice in the second group of driver slices is enabled.

17. The apparatus of claim 16, wherein the fourth differential predriver is configured to propagate the differential input data signal to a first set of buffer circuits that includes the second differential predriver and the fifth differential predriver is configured to propagate the differential input data signal to a second set of buffer circuits that includes the third differential predriver, wherein the second set of buffer circuits includes more buffer circuits than the first set of buffer circuits, and wherein at least one buffer in the apparatus is disabled when the first set of buffer circuits or the second set of buffer circuits is enabled.

18. The apparatus of claim 11, further comprising:
means for driving an output of the apparatus, including differential voltage drivers in the driver slices, wherein each differential voltage driver has an output coupled to the output of the apparatus and an input coupled to an output of the first differential predriver in its driver slice.

19. The apparatus of claim 11, further comprising:
pulldown transistors coupled to outputs of at least one driver slice, wherein the pulldown transistors are turned on when the first differential predriver of the at least one driver slice is disabled.

20. The apparatus of claim 11, further comprising:
pullup transistors coupled to outputs of at least one driver slice, wherein the pullup transistors are turned on when the first differential predriver of the at least one driver slice is disabled.

21. A method for transmitting a data signal over a communication link, comprising:
receiving a control code that is configured to enable one or more driver slices in a plurality of driver slices coupled to an output of a transmitter circuit coupled to the communication link;
using a first switch to enable a first differential predriver in at least one driver slice in a first group of driver slices when indicated by the control code;
enabling a second differential predriver when the at least one driver slice in the first group of driver slices is enabled, wherein the second differential predriver is configured to provide a first differential buffered data signal to inputs of the first group of driver slices when the second differential predriver is enabled;
using a second first switch to enable the first differential predriver of at least one driver slice in a second group of driver slices when indicated by the control code; and
enabling a third differential predriver when the at least one driver slice in the second group of driver slices is enabled, wherein the third differential predriver is configured to provide a second differential buffered data signal to inputs of the second group of driver slices when the third differential predriver is enabled.

22. The method of claim 21, wherein each driver slice in the first group of driver slices is excluded from the second group of driver slices.

23. The method of claim 21, wherein the first group of driver slices includes more of the driver slices than the second group of driver slices.

24. The method of claim 21, further comprising:
propagating a differential input data signal to the second differential predriver when a fourth differential predriver is enabled, wherein the fourth differential predriver is enabled when a first differential predriver in at least one driver slice in the first group of driver slices is enabled.

25. The method of claim 24, further comprising:
propagating the differential input data signal to the third differential predriver when a first differential predriver in at least one driver slice in the second group of driver slices is enabled.

26. The method of claim 24, further comprising:
propagating the differential input data signal to the third differential predriver when a fifth differential predriver is enabled, wherein the fifth differential predriver is enabled when a first differential predriver in at least one driver slice in the second group of driver slices is enabled.

27. The method of claim 26, wherein the fourth differential predriver is configured to propagate the differential input data signal to a first set of buffer circuits that includes the second differential predriver and the fifth differential predriver is configured to propagate the differential input data signal to a second set of buffer circuits that includes the third differential predriver, wherein the second set of buffer circuits includes more buffer circuits than the first set of buffer circuits, and wherein at least one buffer in the transmitter circuit is disabled when the first set of buffer circuits or the second set of buffer circuits is enabled.

28. The method of claim 21, wherein each driver slice comprises a differential voltage driver having an output coupled to the output of the transmitter circuit and an input coupled to an output of the first differential predriver in the each driver slice.

29. The method of claim 21, wherein pulldown transistors coupled to outputs of at least one driver slice are turned on when the first differential predriver of the at least one driver slice is disabled.

30. The method of claim 21, wherein pullup transistors coupled to outputs of at least one driver slice are turned on when the first differential predriver of the at least one driver slice is disabled.

* * * * *